United States Patent

Rustici

[11] Patent Number: 5,132,558
[45] Date of Patent: Jul. 21, 1992

[54] RECYCLING RAMP INTERPOLATOR

[75] Inventor: David J. Rustici, Loveland, Colo.

[73] Assignee: Hewlett-Packard Co., Palo Alto, Calif.

[21] Appl. No.: 672,145

[22] Filed: Mar. 19, 1991

Related U.S. Application Data

[63] Continuation of Ser. No. 551,683, Jul. 9, 1990, abandoned, which is a continuation of Ser. No. 301,915, Jan. 25, 1989, abandoned.

[51] Int. Cl.$^5$ .................. H03K 5/153; G11C 27/02
[52] U.S. Cl. .................. 307/353; 307/362; 307/269; 328/151
[58] Field of Search .......... 307/352, 362, 246, 261, 307/269, 228; 328/63, 67, 151

[56] References Cited

U.S. PATENT DOCUMENTS

| | | | |
|---|---|---|---|
| 3,577,012 | 5/1971 | Dummermuth | 307/362 |
| 3,982,193 | 9/1976 | Maringer | 307/352 |
| 4,124,821 | 11/1978 | Petr | 307/362 |
| 4,283,713 | 8/1981 | Philipp | 328/151 |
| 4,504,155 | 3/1985 | Ruggieri | 368/121 |
| 4,717,883 | 1/1988 | Browning | 328/151 |
| 4,764,694 | 8/1988 | Winroth | 307/602 |
| 4,769,798 | 9/1988 | Hayashi | 368/121 |
| 4,772,843 | 9/1988 | Asaka et al. | 320/1 |

OTHER PUBLICATIONS

Donald L. Dietmeyer, "Logic Design of Digital Systems" Jan. 1972, pp. 452-483, Allyn and Bacon, Inc.

Primary Examiner—John Zazworsky
Attorney, Agent, or Firm—Guy J. Kelley

[57] ABSTRACT

A recycling ramp interpolator is described which can provide multiple measurements for a single input trigger signal by maintaining initial input waveform reference and interpolating multiple times before completely discharging. The interpolator reference voltage can be changed to provide effective sampling intervals of fractions less than one of the clock period.

8 Claims, 6 Drawing Sheets

RECYCLING RAMP INTERPOLATOR

This application is a continuation of application Ser. No. 07/551,683, filed Jul. 9, 1990, now abandoned, which was a continuation of application Ser. No. 07/301,915, filed Jan. 25, 1989, now abandoned.

BACKGROUND OF THE INVENTION

1. Field of the Invention

The present invention pertains generally to waveform sequential sampling techniques and apparatus.

2. Description of the Background

Measuring an input waveform signal is limited by how fast direct sampling measurements can be taken or by how well a sampling technique can be synchronized to the input waveform and resolve fractions of a clock cycle.

Generally, the highest frequency that can be measured by any type of sampling is one-half of the frequency of the sampling. This is called the Nyquist Frequency. In any digital processing system, there is a minimum allowable sampling frequency called the Nyquist Frequency and it is specified by the Sampling Theorem, summarized as follows: When digitizing an analog signal, the sampling rate must be at least twice as great as the highest frequency component (fo) in the spectrum of the sampled signal. Frequency components higher than fo will "alias" down into the frequency range below fo and interfere with the accurate representation of the sampled signal. To avoid signal distortion caused by aliasing, the effective sample interval must meet the Nyquist criterion of 1/(2fo). In direct sampling, the effective sample interval is the actual time between measurements. Therefore, for a 20 microseconds sample interval, the maximum signal frequency which can be measured without distortion is 25 KHz. Also, if higher frequencies are present, then a low-pass filter of bandwidth fo and less should be inserted in the input signal path.

Sequential sampling (also known as sub-sampling) techniques can reduce the effective sample interval and thus, allow measurement of higher frequency waveforms or provide greater resolution and accuracy for a given frequency waveform. In order to do sequential sampling, the waveform to be measured must be repetitive since the period is reconstructed in several passes of the waveform. For sequential sampling, the effective sample interval is the time between samples of the reconstructed waveform. For instance, if the effective sampling period is 35 nanoseconds then a frequency of 14 MHz can be measured. Also, sequential sampling can be done on waveforms which would be within the Nyquist criterion for direct sampling, but a higher resolution and greater accuracy is desired.

In order to perform sequential sampling, the measurement sample taken must be referenced to a known point on the input waveform. Sequential sampling gives a series of measurements. Since these measurements are taken over multiple periods of the input waveform, the order in which the measurements are taken is not necessarily an indication of the order of the measurements on the waveform. Generally, the measurements must be rearranged to reflect the true position on the input waveform. This ordering is done by using a reference on the input signal. All measurements are taken with respect to this known reference value. A trigger is established on this reference value. When the input waveform attains the reference value, this causes a trigger. Measurements taken, are taken from a given known delay time from the trigger. This delay time, from when the trigger occurs to when the measurement is taken, is measured. The accuracy of reconstructing the input waveform is a function of how well this delay time can be measured. In this way, signal value and time can be correlated and the signal reconstructed. The trigger can be established by the level and slope of the input signal. For example, a trigger would occur at the raising zero voltage crossing of a waveform. The delay time can be a predetermined number of clock cycles. For example, a first measurement would be taken four (4) clock cycles after the trigger, the second measurement taken five (5) clock cycles after the trigger, and so forth until enough measurements were taken to resolve the input waveform. In this example, the effective sampling interval would be one clock cycle.

As seen above, after each measurement, the predetermined delay is changed so as to effectively take a measurement on a different part of the input waveform. Often, the delay would be incremented by one clock cycle, and therefore, for a 10 MHz clock, the effective sampling interval would be 100 nanoseconds and the Nyquist Frequency would be 5 MHz.

The predetermined delay, for the most part, is counted by an internal clock. However, since the trigger can occur anytime during a clock cycle, the precision of the predetermined delay will depend on the length of the clock cycle and the particular technique chosen to interpolate between the clock cycles to determine when the trigger occurred.

Sequential sampling techniques handle the problem of the delay between a trigger and a clock edge in various ways. One method is to do nothing about this delay and calculate the uncertainty into the resolution, thus reducing the resolution of the input waveform reconstruction. It is likely that the input signal to be synchronized will come in-between a clock pulse. A clock pulse on a 10 MHz. clock comes every 20 MHz or 50 nanoseconds. If one were to wait until a clock pulse in order to synchronize the clock to the waveform, the synchronization could be displaced from 0 to 50 nanoseconds: a maximum error of 50 nanoseconds. For some purposes, this error would be adequate and is tolerated. For accurate measurements on high speed waveforms, this error is intolerable.

Preferably, sequential sampling techniques interpolate between the clock cycles. One way is to use a phase triggerable phase lock loop. This method is expensive and requires complicated circuitry. Also, another method is to use delay line circuitry. This requires dedicated precisely controlled circuitry. A common method is to use a ramp interpolator. A ramp interpolator is usually in the form of a constant current source, a capacitor, a comparator, and the appropriate switches. On a given signal, the constant known current source charges the capacitor. At the end of the duration that is to be measured, the current source is disconnected from the capacitor. The voltage on the capacitor is equivalent to the duration to be measured. The duration can be found by discharging the capacitor at a known current and using that time interval as an equivalence to the first duration or the voltage could be measured or compared and the delay time calculated from known calibration points or a look-up table.

Another way of using a ramp interpolator is to interpolate between clock cycles and use the measured duration to add on another duration to complete one clock cycle or a predetermined number of clock cycles. This allows synchronization of the clock to an unknown input waveform. The ramp interpolator will measure the duration between the input trigger and the next clock pulse, and add on the complement duration so the clock becomes synchronized to the input waveform. The single cycle ramp interpolator then completely discharges and waits for another trigger before measuring another duration.

Sub-sampling techniques often require 500 or more samples in order to adequately reconstruct the input waveform. Using a single cycle ramp interpolator takes a relatively long time since it will have to wait for 500 triggers or 500 periods of the input waveform.

Also, single cycle ramp interpolators are generally limited to changing the predetermined delay between the trigger and the measurement by one clock cycle at a time, thus limiting the effective sample rate to one clock cycle. Therefore, a 10 MHz clock would have an effective sample rate of 100 nanoseconds and would be limited to measuring frequencies of less than 5 MHz. The problem is to reduce the time needed to reconstruct an input waveform and decrease the effective sample interval.

SUMMARY OF THE INVENTION

The present invention overcomes the limitations of the prior art by providing a recycling ramp interpolator apparatus for use in waveform sub-sampling techniques which increases the speed of the sub-sampling routine by providing a plurality of trigger out signals for a single input trigger signal. The apparatus comprises a clock having cycles and producing signals, an input means for receiving an input trigger signal and initiating charge accumulation, a charge accumulator means connected to the input means, responsive to the input trigger signal, having a connection to the clock and receiving signals therefrom, and responsive to the clock. The charge accumulator means accumulates a first charge in response to the input trigger signal, holds the first charge in response to a first predetermined clock signal, and accumulates additional charge in response to a second predetermined clock signal, then discharges the accumulated additional charge in response to the accumulated additional charge reaching a predetermined reference voltage level. The first charge is held for an integral number of clock cycles from the time of the second predetermined clock signal until a third predetermined clock signal and then it accumulates additional charge in response to the third predetermined clock signal. An output means produces a trigger out signal in response to the charge accumulator means accumulating additional charge reaching the predetermined reference voltage level. The trigger out signal can be used to determine when a measurement of an input waveform is to be taken.

The present invention further overcomes the limitations of the prior art by providing a predetermined reference voltage level which can be changed after the output means produces a trigger out signal and before producing a second trigger out signal in response to the additional charge accumulation means reaching the changed predetermined reference voltage level in order to provide for fractions of a clock cycle changes in delay.

The present invention reduces the time it takes to reconstruct an input waveform by taking multiple readings per input trigger signal. The Recycling Ramp Interpolator eliminates the need for the ramp interpolator to be in the discharged state before a measurement can be taken. Multiple measurements of the input waveform can be taken with only one input trigger signal. The prior delay time between the trigger and the clock pulse is captured and used for a series of measurements. This eliminates the need to wait for another input trigger signal before another measurement can be taken and consequently, reduces the number of repetitions of the input waveform required before reconstruction can be accomplished.

Also, the Recycling Ramp Interpolator allows effective sampling intervals which are a fraction of the clock cycle. By calibrating the voltage created by the accumulated charge and changing the reference voltage of the second ramp between bursts of measurements, fractions of a clock cycle delay can be obtained. A typical range is one-third to one-tenth of the clock cycle. Therefore, for example, a 10 MHz. clock can have an effective sampling interval of 10 nanoseconds.

DETAILED DESCRIPTION

Figure 1:
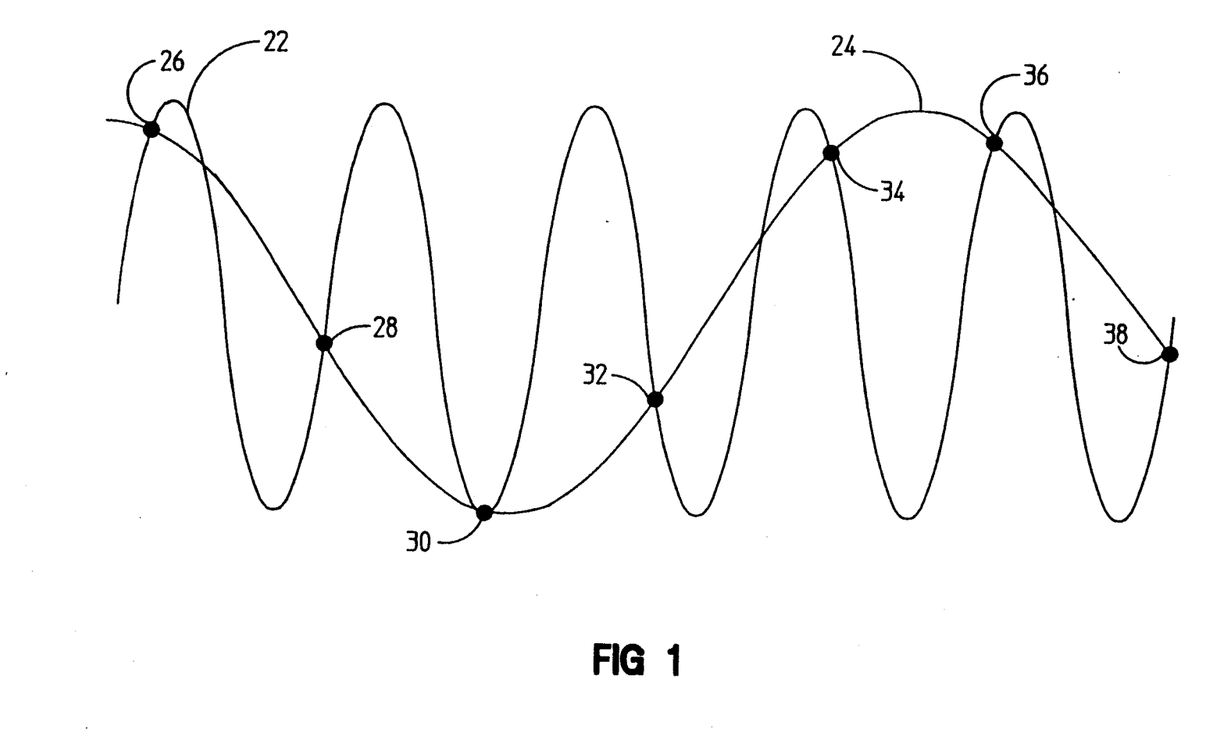
FIG. 1 shows aliasing caused by undersampling, trying to measure an input waveform frequency more than one-half of the effective sample rate.

FIG. 1 shows what happens when an input waveform (22) is measured by a sampling rate that is less than the Nyquist Frequency. The input waveform is measured at points 26, 28, 30, 32, 34, 36, and 38. By looking at the input waveform (22) through these points, an Alias Frequency (24) is indicated rather than the true input waveform (22).

Figure 2:
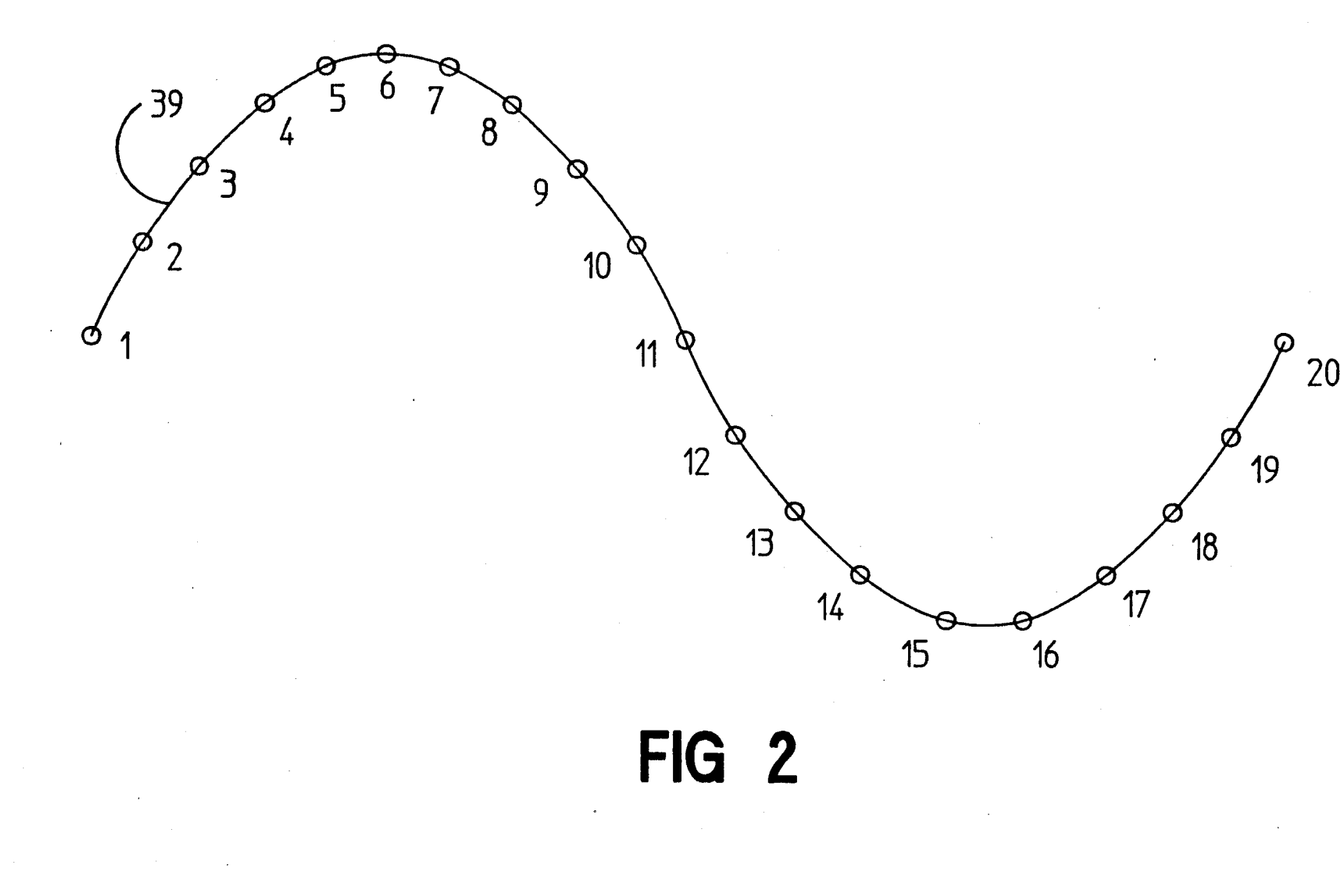
FIG. 2 illustrates how direct sampling is done and the reconstructed waveform.
Figures 3A, 3B:
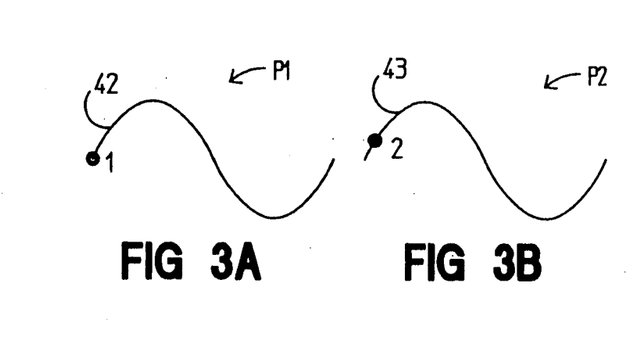
FIGS. 3A-3F illustrate an example of previous methods of sequential sampling using one measurement per input trigger signal and the subsequent reconstructed waveform.
Figure 3C:
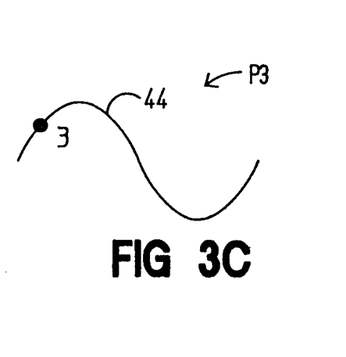
Figure 3D:
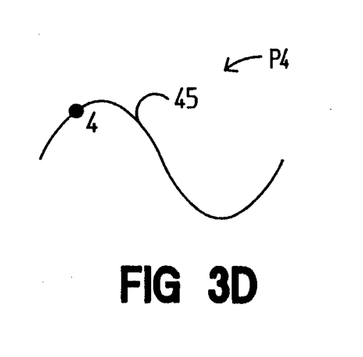
Figure 3E:
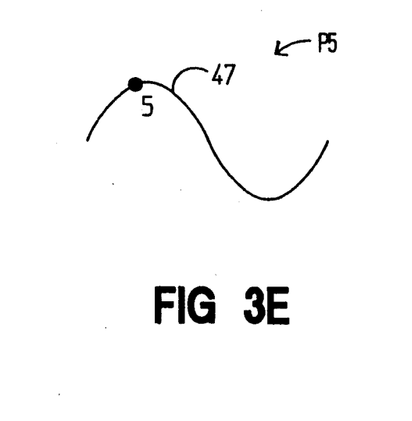
Figure 3F:
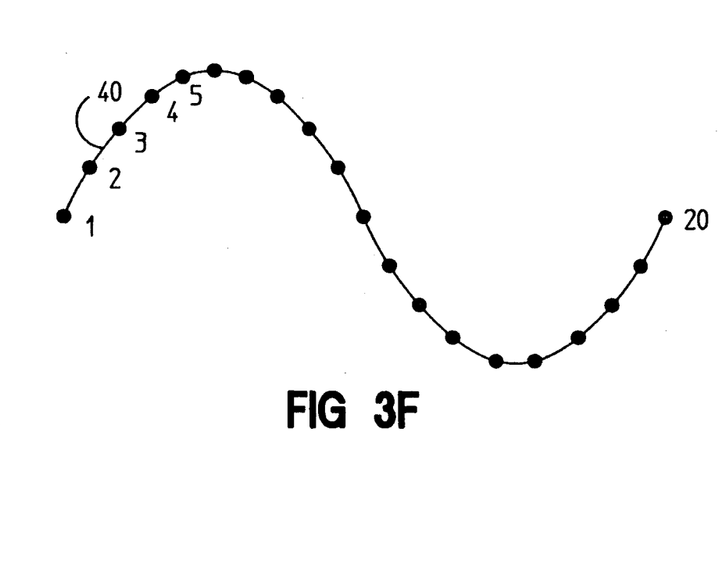
Figure 4A:
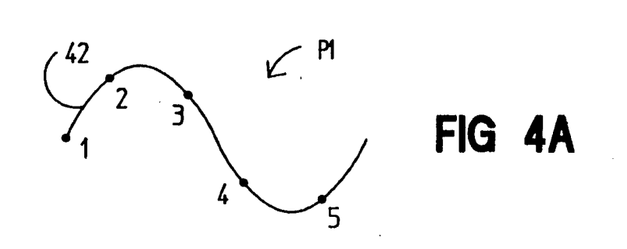
FIGS. 4A-4E illustrate an example of the Recycling Ramp Interpolator sequential sampling using a burst of five measurements per trigger. And all five measurements are done within one period.
Figure 4B:
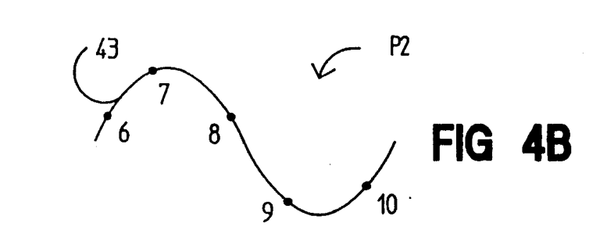
Figure 4C:
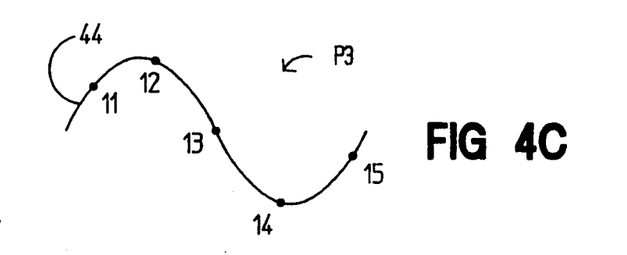
Figure 4D:
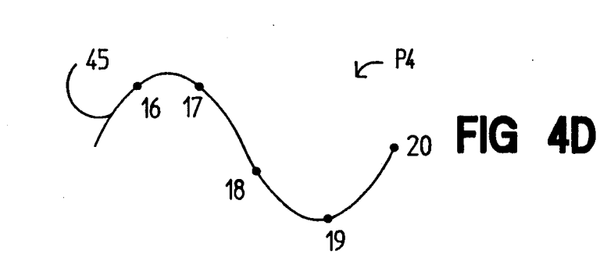
Figure 4E:
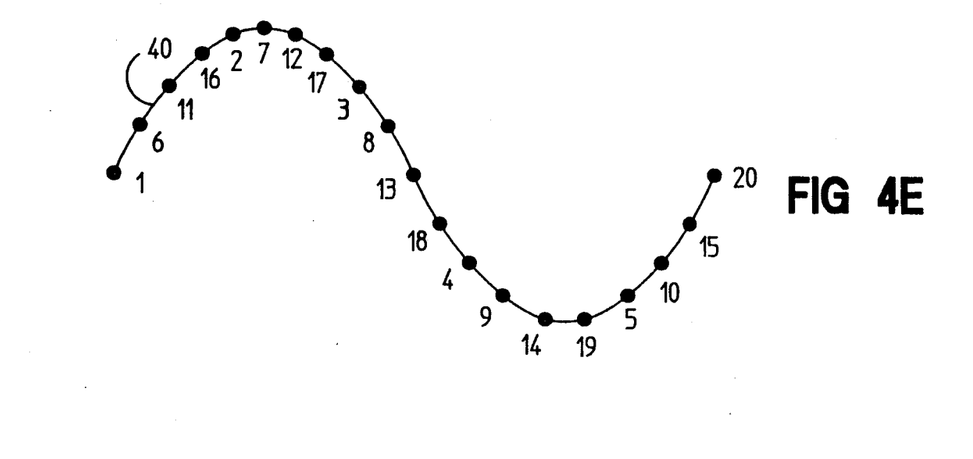

FIG. 2 shows an input waveform (39) being reconstructed by direct sampling points 1-20. The direct sampling frequency is well above the Nyquist Frequency so the input waveform is accurately reconstructed. The effective sample interval is 1/20 of the period of the input waveform in this case. The time interval between any two measurements is constant.

FIG. 3 shows how a typical sequential sampling method reconstructs the input waveform. After each input trigger signal, one measurement is taken. The delay time between the input trigger signal and the measurement is changed after each measurement. For example, the measurement at point 1 may occur five clock cycles after the input trigger signal, then the delay may be incremented by one clock cycle for each measurement after that. The next delay, between the input trigger signal and point 2, is six clock cycles. The one after that, point 3, would be seven clock cycles. This would continue, so that the delay between the input trigger signal and point 20 would be twenty-four clock cycles. In this example, points 1-20 are enough to reconstruct the input waveform. More points could be taken for input waveforms with larger periods. As one can see, this requires one period of the input waveform per measurement or in this case, twenty repetitions of the input waveform. Probably more repetitions are required because of circuit limitations requiring a certain amount of time before being ready for another input trigger signal. That is, while measurement at point 1 is being taken, the circuit may be disabled from triggering on the input waveform for several periods, then the circuit is set to increment the delay and readied to receive another input trigger signal. The measurements are reconstructed and the order resembles the direct sampling method.

The difference between the direct sampling method and this sequential sampling method is the effective sample rate. The direct sampling method is limited to how fast one sample can be taken after another. A delay of many clock cycles can occur while the measurement is taken and the circuit is set to receive another measurement. Typically, this delay is determined by the speed of the Analog-to-digital converter used in the measurement process. On the other hand, the sequential sampling method can take samples one clock cycle apart, albeit on different periods, so the effective sampling interval is one clock cycle.

FIG. 4 shows sequential sampling by the present invention of the input waveform (40). In this case, at least four repetitions of the waveform are required before it can be reconstructed. In any given period, the time between two adjacent measurements are equal. For instance, the time between point 1 and point 2 are equal to the time between points 2 and 3, between points 3 and 4, and between points 4 and 5.

Point 1 is a measurement taken in response to an input trigger which is triggered by a known value of the input waveform (i.e. zero value raising slope). The measurement taken at point 1 is delayed by a known amount of time from the trigger point. Point 6, 11, and 16 are all initiated by the input trigger as is point 1. However, the delay between the known value of the input waveform and the measurement is changed. This change in delay is the effective sampling interval. For the present invention, this delay can be controlled to a fraction of a clock cycle. Often, this fraction is one-tenth (0.1) of a clock cycle, so the effective sampling interval, for a 10 MHz clock, is 10 nanoseconds. So, for example, the delay between the input trigger and measurement point 1 may be 4.5 clock cycles, then the delay between the input trigger signal and measurement point 6 may be 4.6 clock cycles, point 11 may be 4.7 clock cycles, and point 16 may be 4.8 clock cycles.

As seen in this figure, the present invention allows multiple measurements to be taken for one input trigger signal. These multiple measurements per input trigger signal are called a "burst". In this example, five measurements are taken for each input trigger signal, thus reducing the measurement periods to four instead of the twenty needed for the previous sequential sampling method. However, as noted above, more repetitions of the input waveform may be needed because of circuit delays between taking the measurements and initiating another burst. Period 2 (43) may not be the next-in-time period after Period 1 (42). There may be several periods between while the measuring circuit readies itself for another input trigger signal.

The advantage becomes more readily apparent at greater sampling. For instance, if 500 points were taken for reconstruction of the input waveform and ten samples taken per input trigger signal then this method would only require fifty measurement periods of the input waveform instead of 500.

The number of measurements per burst and the incremental delay time can be adjusted depending on how fast the input waveform needs to be reconstructed and by how accurately one wants to reconstruct it. The more measurements per burst and smaller incremental delay times will yield a slower, but more accurate reconstruction. The less measurements per burst and larger incremental delay times will yield a faster, but potentially less accurate reconstruction.

Also, all measurements in one burst need not be taken within the same period of the input waveform. FIG. 4 is a particular example where all five measurements in the burst happen to be within the same period of the input waveform. This was chosen for illustration purposes to simplify the explanation of the invention. For instance, when all the burst measurements do not happen to be within the same period of the input waveform given a five measurement burst, while measurements 1 and 2 are done on the same period, measurements 3 and 4 might be on a second period, and five on a third period. The time relationship between the points would stay the same, but the frequency of the input waveform, in the case when all the burst measurements do not happen to be within the same period of the input waveform, would be higher relative to the frequency of the input waveform illustrated in FIG. 4. Another instance would be that each measurement is on a different period of the input waveform even though the input trigger point is, still, only initiated once on the first period of the input waveform. Even if there is only one measurement per period, the Recycling Ramp Interpolator is still generally faster than the single cycle ramp interpolator since it does not have to wait for initializing an input trigger for each measurement. For example, for a given frequency, measurement 1 and measurement 2 may be separated by one period on the recycling ramp interpolator. However, on a dual ramp interpolator, measurements 1 and 2 may be separated by several periods of the input waveform while the input trigger is reset because the input trigger has to discharge completely and then wait for the known reference value on the input waveform to occur.

Figure 5:
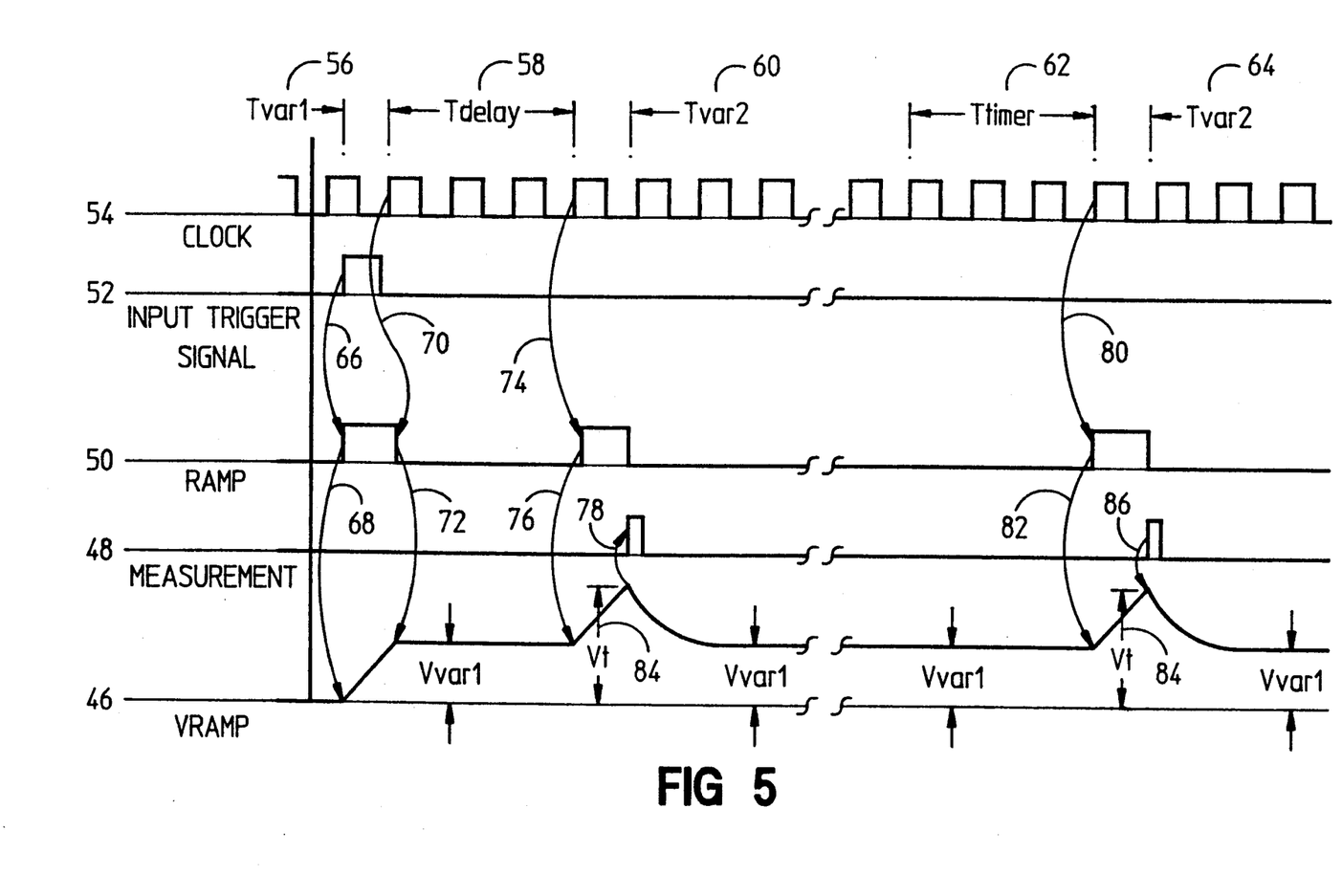
FIG. 5 correlates the five events of clock cycle; the input trigger signal referenced to the input waveform, the ramp signal which begins charge accumulation and additional charge accumulation, the trigger out signal which signals for a measurement to be taken on the input waveform, and the voltage of the ramp which is the charge accumulation and additional charge accumulation used to interpolate between clock cycles and increment sequential sampling by fraction of clock cycles.

FIG. 5 shows the relationship of the timing between the clock, the input trigger signal, the ramp, the measurement, and the Recycling Ramp Interpolator. The input trigger signal (52) can occur at any time (66) during a clock cycle (54). When the input trigger signal occurs, it starts a ramp (50) which in turn starts the charge accumulator and vramp (46) changes proportionally until a designated clock pulse, in this case, the raising edge (70). The clock pulse stops the ramp (50) which in turn stops the change in vramp (72). This voltage is held for a predetermined number of clock periods (58) which in this case is three clock cycles, then the ramp is started at the second predetermined clock signal(74) which starts additional charge accumulation and vramp (76) changes proportionally. When vramp attains a predetermined voltage Vt (84), a measurement is taken (78). A second measurement (80) of the burst can be taken by waiting a second predetermined number of clock cycles from the second raising clock edge (74) during which the additional charge accumulation is discharged. Then, starting another ramp which accumulates additional charge and vramp (82) changes proportionally until it reaches Vt and another measure (86) is taken. Vt (84) can be adjusted after each burst and before the next input trigger signal so that it takes a fraction of a clock cycle longer to attain and initiate the measurement. This adjustment of Vt (120) decreases the effective sampling interval. Adjustment means changing Vt from a first value to a second value. The difference between the second value and the first value is a predetermined incremental amount calculated to be equivalent to a fraction of one clock cycle. In this way, when Vt is adjusted, the next measurement will occur at a different point in the clock cycle.

Figure 6:
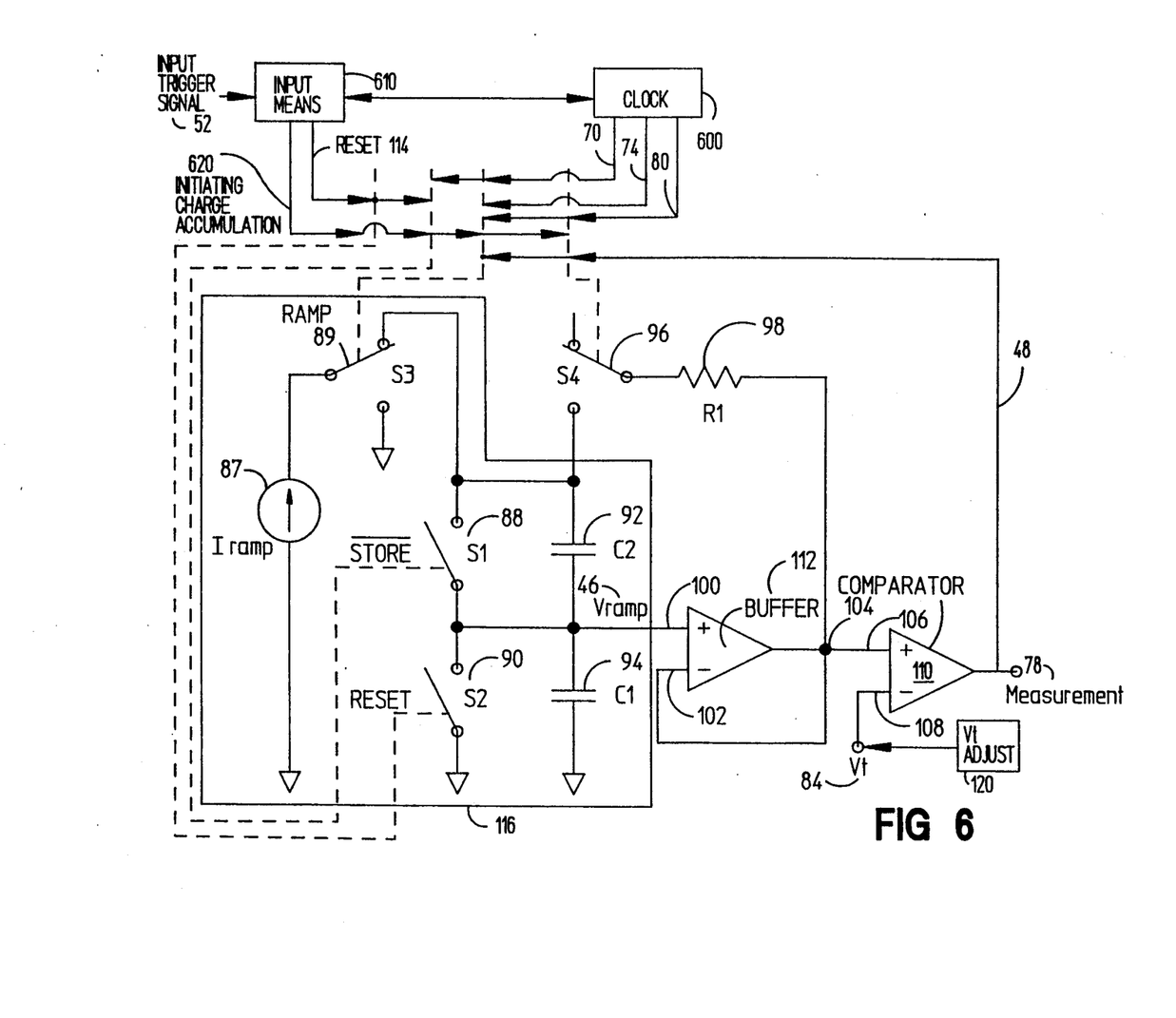
FIG. 6 illustrates a schematic of an embodiment of the invention using two capacitors.

FIG. 6 shows a schematic implementation of the Recycling Ramp Interpolator. A calibrated current source (87) is connected to a switch (89). Switch (89) toggles between ground (open) and ramp (close). The input trigger signal (52) opens switch (96), closes switch (89), and connects the calibrated current source to the charge accumulator means (116) via the input of the charge accumulator. The charge accumulator has a store switch (88) connected to the charge accumulator input, which closes in response to the input trigger signal so that capacitor C1 (94) accumulates charge. The input means connects to the charge accumulator (116) having a connection to the clock (600). C1 accumulates charge for a first duration of time until a first designated clock signal. At the first designated clock signal (70), switch (89) opens and voltage is held essentially constant on capacitor (94). After switch (89) opens, but before a predetermined number of clock cycles from the first designated clock signal, the store switch (88) opens. At the predetermined number of clock cycles, the second predetermined clock signal (74) occurs and the calibrated current source is connected to the capacitors (92) and (94) by closing switch (89). The buffer (112) has its positive input (100) connected to the output of the charge accumulator. The capacitors of the charge accumulator accumulate additional charge until the positive input (106) of the comparator (110) which is coupled to the charge accumulator output through the positive comparator input (106) connected to the buffer output (104) equals the negative input (108) which is set at Vt (84), the reference voltage. Then, a measurement or trigger output signal (48) is sent which opens the ramp switch (89) disconnecting the calibrated current source from the capacitors 92 and 94, closes switch 96, by moving the switch to the discharge position from the open position, connecting the buffer (112) output (104) the input of the charge accumulator and, thus the capacitors 92 and 94, and the buffer (112) having the buffer positive input connected to the charge accumulator output, discharges the additional accumulated charge. The buffer negative input (102) is connected to the buffer output (112). The accumulated charge is held for a second predetermined number (80) of clock cycles from the second designated clock signal when switch 96 opens and the calibrated current source (87) is again connected to the charge accumulator having the capacitors 92 and 94 by closing switch 89 so additional accumulated charge is again accumulated until the positive comparator input (106) equals Vt (84) when a second measurement signal is sent. A third and subsequent measurements can be taken in this burst by only discharging the additional accumulated charge again or the entire circuit can be reset (114) to await a second input trigger signal by closing reset switch (90) and store switch (88).

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A recycling ramp interpolator apparatus for use in waveform sub-sampling techniques which provide for an effective sample interval, the apparatus increases the speed of the sub-sampling routine by providing a plurality of trigger out signals for a single input trigger signal, the apparatus comprising:
   a clock having cycles and producing signals;
   an input means for receiving an input trigger signal and initiating charge accumulation;
   a charge accumulator means connected to the input means, responsive to the input trigger signal and to a plurality of clock signals, having a connection to the clock and receiving signals therefrom, and responsive to the clock,
      for accumulating a first charge in response to the input trigger signal,
      for holding the first charge in response to a first predetermined clock signal,
      for accumulating additional charge in response to a second predetermined clock signal,
      for discharging the accumulated additional charge in response to the accumulated additional charge reaching a predetermined reference voltage level,
      for holding the first charge for an integral number of clock cycles from the time of the second predetermined clock signal until a third predetermined clock signal;
      for accumulating additional charge in response to the third predetermined clock signal;
   an output means for producing a trigger out signal in response to the charge accumulator means accumulating additional charge reaching the predetermined reference voltage level.

2. The apparatus of claim 1 further comprising:
   a reference voltage adjust for further decreasing the effective sample interval, the reference voltage adjust increments the predetermined reference voltage level to a second predetermined voltage level by an incremental amount equivalent to a predetermined non-integral fraction of a clock cycle.

3. The apparatus of claim 1 wherein the charge accumulator means for accumulating a first charge in response to the trigger comprises a first capacitor, a reset switch, and an additional charge accumulator.

4. The apparatus of claim 3 wherein the additional charge accumulator comprises a second capacitor connected in series with the first capacitor and a store switch connected in parallel with the second capacitor, the store switch being in a closed position during accumulation of the first charge and being in the open position during accumulation of the additional charge.

5. The apparatus of claim 1 wherein the output means comprises a comparator means for comparing a sum of the accumulated additional charge plus the first charge to the reference voltage level and for producing an output trigger signal.

6. A sequential sampling method for sampling an input signal using a recycling ramp interpolator comprising the steps of:
 receiving an input trigger signal;
 measuring a first duration between the input trigger signal and a first designated clock signal;
 receiving a second predetermined clock signal;
 measuring a fractional clock cycle which is complement of the first duration so that the combination of the first duration and the complement is equivalent to a predetermined number of clock cycles;
 sending a first measurement signal;
 measuring another complement of the first duration;
 sending a second measurement signal.

7. A sequential sampling method for sampling an input signal using a recycling ramp interpolator comprising the steps of:
 receiving a first input trigger signal;
 measuring a first duration between the input trigger signal and a first designated clock signal;
 waiting until the end of a first integral number of clock cycles;
 measuring a first fractional clock cycle which is a complement of the first duration so that the combination of the first duration and the complement is equivalent to a first predetermined number of clock cycles;
 sending a first measurement signal;
 receiving a second input trigger signal;
 measuring a second duration between the second input trigger signal and the first designated clock signal;
 waiting until the end of the first integral number of clock cycles;
 measuring a second fractional clock cycle which is a complement of the second duration so that the combination of the second duration and the complement is equivalent to the first predetermined number of clock cycles plus a fraction less than one of a clock cycle;
 sending a second measurement signal.

8. A recycling ramp interpolator apparatus for use in waveform sub-sampling techniques which provide for an effective sample interval, the apparatus increases the speed of the sub-sampling routine by providing a plurality of trigger out signals for a single input trigger signal, the apparatus comprising:
 a charge accumulator means, responsive to the input trigger signal and to a plurality of clock signals,
  for accumulating a first charge in response to the input trigger signal,
  for holding the first charge in response to a first predetermined clock signal,
  for accumulating additional charge in response to a second predetermined clock signal,
  for discharging the accumulated additional charge in response to the accumulated additional charge reaching a predetermined reference voltage level,
  for holding the first charge for an integral number of clock cycles from the time of the second predetermined clock signal until a third predetermined clock signal;
  for accumulating additional charge in response to the third predetermined clock signal;
 an output means for producing a trigger out signal in response to the charge accumulator means accumulating additional charge reaching the predetermined reference voltage level.

* * * * *